(12) United States Patent
Lam et al.

(10) Patent No.: US 11,233,519 B1
(45) Date of Patent: Jan. 25, 2022

(54) PHASE SKIPPING TECHNIQUE FOR HIGH-SPEED, HIGH-PHASE NUMBER DELAY LOCKED LOOP

(71) Applicant: Ciena Corporation, Hanover, MD (US)

(72) Inventors: Jerry Yee-Tung Lam, Stittsville (CA); Sadok Aouini, Gatineau (CA); Marinette Besson, Ottawa (CA); Matthew Baby Varghese, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/315,506

(22) Filed: May 10, 2021

(51) Int. Cl.
 *H03L 7/081* (2006.01)
 *G06F 1/06* (2006.01)
 *H03L 7/093* (2006.01)
(52) U.S. Cl.
 CPC .............. *H03L 7/0812* (2013.01); *G06F 1/06* (2013.01); *H03L 7/093* (2013.01)
(58) Field of Classification Search
 CPC ... H03L 7/0812; H03L 7/0816; H03L 7/0818; H03L 7/085; H03L 7/093
 See application file for complete search history.

(56) References Cited

U.S. PATENT DOCUMENTS

2004/0222866 A1* 11/2004 Stengel .................. H03K 5/133
 332/109
2007/0285138 A1 12/2007 Bhowmik et al.
2016/0013796 A1* 1/2016 Choi ...................... H03L 7/095
 327/158

* cited by examiner

*Primary Examiner* — Diana J. Cheng
(74) *Attorney, Agent, or Firm* — Clements Bernard Baratta; Lawrence A. Baratta, Jr.; Christopher L. Bernard

(57) ABSTRACT

A delay locked loop (DLL) circuit includes inputs from M-phase clocks, M is an integer that is greater than or equal to 1; N delay cells in each of M separate delay lines, one delay line for each of the inputs from the M-phase clocks, and each of the N delay cells having a delay of k*Δt, N is an integer, and k is an integer that is coprime with both N and M; N outputs for clock phases from the N delay cells; and an alignment circuit connected to outputs of the M separate delay lines and the inputs from the M-phase clocks and configured to provide phase locking.

16 Claims, 10 Drawing Sheets

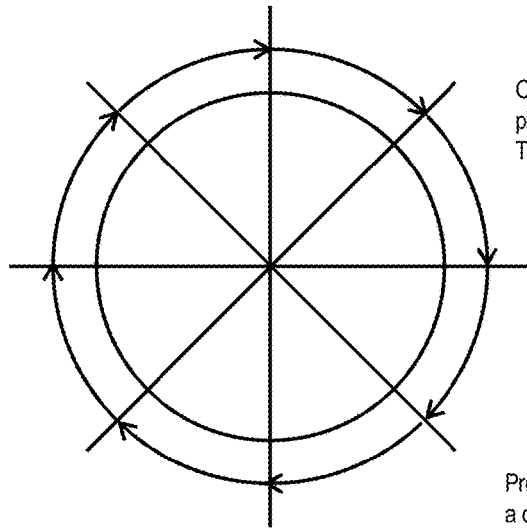

FIG. 2

Conventional operation: each of the N phases has a delay of Δt=2π/N rad.
Total delay is N* 2π/N= 2π rad

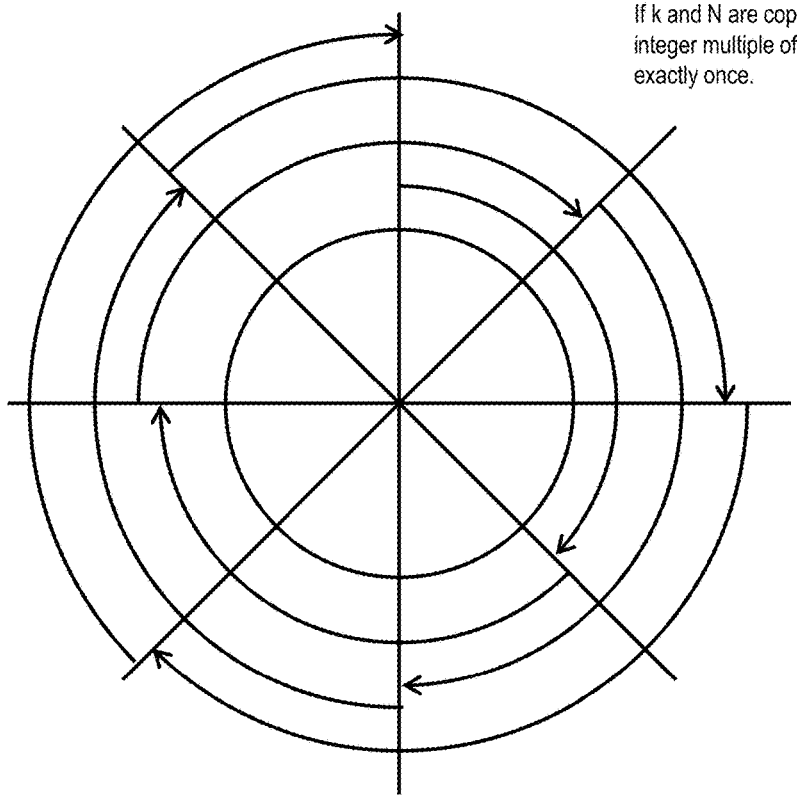

Proposed DLL: each of the N phases has a delay of Δt=2πk/N rad.
Total delay is N* 2πk/N= 2πk rad
If k is an integer, the final phase will be congruent to the starting point and can be compared to the reference phase.
If k and N are coprime, every phase at an integer multiple of 2π/N will be produced exactly once.

FIG. 3

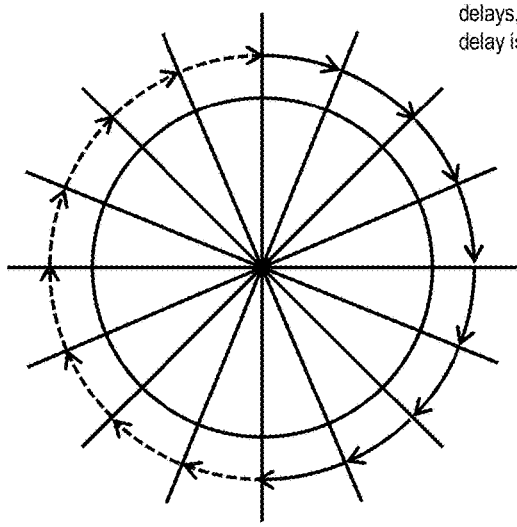

Conventional DLL: Input reference clock with 2 phases, each π rad apart.
Each phase passes through a delay line with N/2 delays, each with a delay of Δt=2π/N rad. Total delay is N/2*2π/N= π rad

FIG. 5

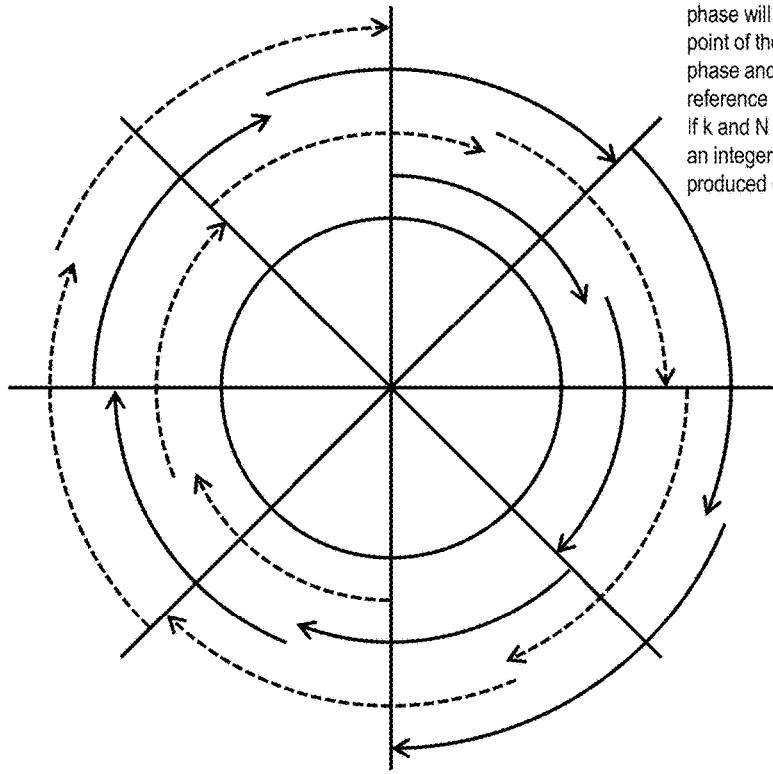

Proposed DLL: Input reference clock with 2 phases, each π rad apart.
Each phase passes through a delay line with N/2 delays, each with a delay of Δt=2πk/N rad for some integer k. Total delay is N/2*2πk/N= kπ rad
If k is an integer and odd, the final phase will be congruent to the starting point of the opposite phase of the input phase and can be compared to that reference phase.
If k and N are coprime, every phase at an integer multiple of 2π/N will be produced exactly once.

FIG. 6

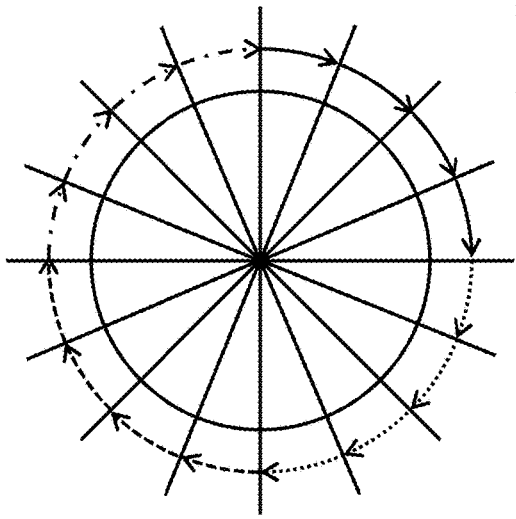

Conventional operation: Input reference clock with M phases, each $2\pi/M$ rad apart. Each phase passes through a delay line with N/M delays, each with a delay of $\Delta t = 2\pi/N$ rad. Total delay is $N/M \cdot 2\pi/N = 2\pi/M$ rad

FIG. 10

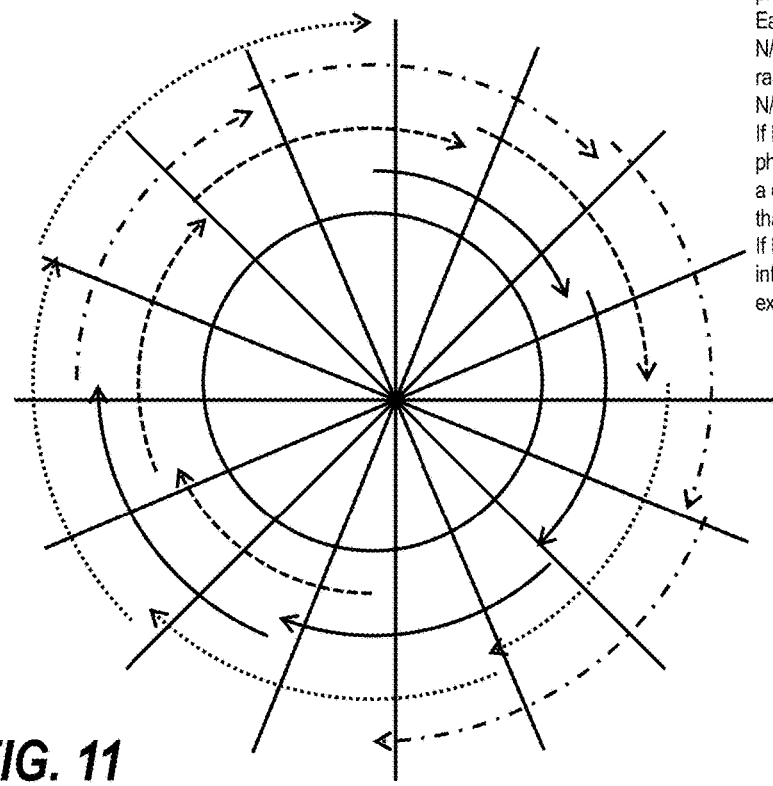

Proposed DLL: Input reference clock with M phases, each $2\pi/M$ rad apart.
Each phase passes through a delay line with N/M delays, each with a delay of $\Delta t = 2\pi k/N$ rad for some integer k. Total delay is $N/2 \cdot 2\pi k/N = k\pi$ rad
If k is an integer and coprime with M, the final phase will be congruent to the starting point of a different branch and can be compared to that reference phase.
If k and N are coprime, every phase at an integer multiple of $2\pi/N$ will be produced exactly once.

FIG. 11

PHASE SKIPPING TECHNIQUE FOR HIGH-SPEED, HIGH-PHASE NUMBER DELAY LOCKED LOOP

FIELD OF THE DISCLOSURE

The present disclosure generally relates to delay locked loop (DLL) circuits. More particularly, the present disclosure relates to systems and methods for a phase skipping technique for high-speed, high-phase number delay locked loop.

BACKGROUND OF THE DISCLOSURE

Delay locked loops (DLL) are common circuits used for many purposes, and one function is to create multiple clock phases from a single phase, or differential pair of phases. Decreased delay sizes performed typically by improving delay performance of a unit inverter, using high supply voltages and careful layout techniques. This approach is common, but cannot overcome intrinsic transistor characteristics. Another approach includes the use of separate, independent delay lines and this requires an asymmetrical delay element which can impact the overall matching of the output clock phases. Yet another approach includes the use of a ring oscillator to generate clock phases, and this encounter similar problems as the unit delay for the ring oscillator is the same as for the DLL. Ring oscillators cannot use the phase skipping technique since the dominant oscillation mode will override any other modes present.

A further approach includes dividing down a high frequency clock, and this requires high frequency clock path and dividers. If independent dividers, they must be synchronized, otherwise a divider circuit that can produce all the required phases is needed, which encounters similar problems as above. High frequency clocks with shift registers are a common approach but require high speed clock distribution and generation (requiring high power and design complexity), and also require shift registers with very low output latency. Another approach includes active inductors and other pole cancellation circuit, but there is limited capability to cancel poles above a certain frequency. Yet another approach includes the use of physical inductors (can cancel poles to a much higher frequency compared to active inductors, but requires large silicon area, especially for high number of phases). Yet another approach includes a feed forward delay line, using previous phases and feeding them forward to boost speed of subsequent phases. This can reduce the delay for a unit delay element has increased wiring complexity and additional parasitic, which can potentially limit the scalability of this approach. Finally, another approach includes Vernier delay lines that use intentionally mismatched delay elements to create a differential delay smaller than the minimum delay size, but have asymmetrical performance (sensitivity to noise, process/voltage/temperature).

The aforementioned approaches have disadvantages, including limitation of process technology, size, area, power consumption, design complexity, the need for complex calibration or synchronization circuitry, and difficulty in testing.

BRIEF SUMMARY OF THE DISCLOSURE

The present disclosure relates to systems and methods for a phase skipping technique for high-speed, high-phase number delay locked loop. The present disclosure includes modification of the conventional operation of a M-phase DLL where the delays of each delay cell are multiples of the DLL unit intervals (UI). This is used to relax the performance requirements of each delay cell, or extend the frequency and/or number of phases higher than would normally be possible. It is known that a DLL circuit can lock to different phases of the input clock period other than the one intended. This is known as false locking. However, this is normally treated as a region that must be avoided, and is considered a design problem. Thus, in conventional operation, DLLs are designed so that the outputs of consecutive delay stages are consecutive clock phases. The present disclosure takes advantage of this region of operation and uses it to implement a high frequency, high phase number DLL that would otherwise be very difficult to achieve. By removing the restriction that the outputs of consecutive delay stages are consecutive clock phases, the DLL circuit can be designed lock to a different phase of the input clock, including a multiple of the input clock.

In an embodiment, a delay locked loop (DLL) circuit includes inputs from M-phase clocks, M is an integer that is greater than or equal to 1; N delay cells in each of M separate delay lines, one delay line for each of the inputs from the M-phase clocks, and each of the N delay cells having a delay of $k*\Delta t$, N is an integer, and k is an integer that is coprime with both N and M; N outputs for clock phases from the N delay cells; and an alignment circuit connected to outputs of the M separate delay lines and the inputs from the M-phase clocks and configured to provide phase locking.

M can be greater than or equal to 2, and the clock phases for the M-phase clocks can be each $2*pi/M$ radians apart. $\Delta t$ can equal $1/(F*N)$ where F is a frequency of the M-phase clocks, and a total delay of each of the M separate delay lines can be $(k/M)*(1/F)$.

N can be even and k can be odd. Each of the N delay cells can include an inverter. Outputs of consecutive delay cells in each of the M separate delay lines may not be adjacent clock phases. For each of the M separate delay lines, missing clock phases between the consecutive delay cells can be generated at subsequent points from the consecutive delay cells. The DLL circuit can further include a clock generation circuit connected to each of the N outputs to provide retimed output clocks for each of the M separate delay lines.

In another embodiment, a method includes receiving inputs from M-phase clocks, M is an integer that is greater than or equal to 1; operating N delay cells in each of M separate delay lines connected to the inputs, one delay line for each of the inputs from the M-phase clocks, and each of the N delay cells having a delay of $k*\Delta t$, N is an integer, and k is an integer that is coprime with both N and M; providing N outputs for clock phases from the N delay cells; and locking the N delay cells utilizing an alignment circuit connected to outputs of the M separate delay lines and the inputs from the M-phase clocks.

M can be greater than or equal to 2, and the clock phases for the M-phase clocks can be each $2*pi/M$ radians apart. $\Delta t$ can equal $1/(F*N)$ where F is a frequency of the M-phase clocks, and a total delay of each of the M separate delay lines can be $(k/M)*(1/F)$.

N can be even and k can be odd. Each of the N delay cells can include an inverter. Outputs of consecutive delay cells in each of the M separate delay lines may not be adjacent clock phases. For each of the M separate delay lines, missing clock phases between the consecutive delay cells can be generated at subsequent points from the consecutive delay cells. The DLL circuit can further include a clock generation circuit connected to each of the N outputs to provide retimed output clocks for each of the M separate delay lines.

BRIEF DESCRIPTION OF THE DRAWINGS

The present disclosure is illustrated and described herein with reference to the various drawings, in which like reference numbers are used to denote like system components/method steps, as appropriate, and in which:

FIG. 2 is a graphical illustration of the delay associated with conventional operation of the DLL of FIG. 1.

FIG. 3 is a graphical illustration of the delay associated with operation of the DLL of FIG. 1 based on the present disclosure, namely modified operation to lock to different phases of the input clock period other than the one intended.

FIG. 5 is a graphical illustration of the delay associated with conventional operation of the differential DLL.

FIG. 6 is a graphical illustration of the delay associated with operation of the DLL based on the present disclosure, namely modified operation to lock to different phases of the input clock period other than the one intended.

FIG. 10 is a graphical illustration of the delay associated with conventional operation of the M-phase DLL.

FIG. 11 is a graphical illustration of the delay associated with operation of the M-phase DLL 60 based on the present disclosure, namely modified operation to lock to different phases of the input clock period other than the one intended.

DETAILED DESCRIPTION OF THE DISCLOSURE

Again, the present disclosure relates to systems and methods for a phase skipping technique for high-speed, high-phase number delay locked loop. The present disclosure includes modification of the conventional operation of a M-phase DLL where the delays of each delay cell are multiples of the DLL unit intervals (UI). This is used to relax the performance requirements of each delay cell, or extend the frequency and/or number of phases higher than would normally be possible. It is known that a DLL circuit can lock to different phases of the input clock period other than the one intended. This is known as false locking. However, this is normally treated as a region that must be avoided, and is considered a design problem. Thus, in conventional operation, DLLs are designed so that the outputs of consecutive delay stages are consecutive clock phases. The present disclosure takes advantage of this region of operation and uses it to implement a high frequency, high phase number DLL that would otherwise be very difficult to achieve. By removing the restriction that the outputs of consecutive delay stages are consecutive clock phases, the DLL circuit can be designed lock to a different phase of the input clock, including a multiple of the input clock.

Figure 1:
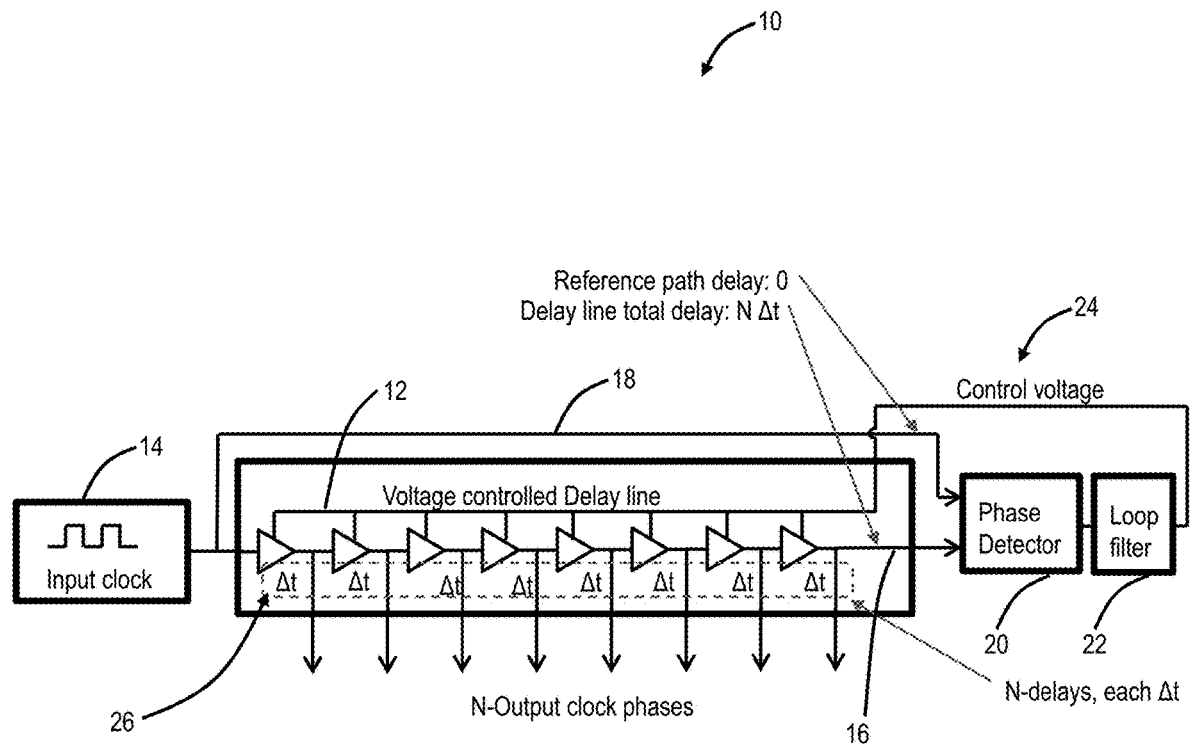
FIG. 1 is a diagram of an example of a DLL.

Again, DLLs are common circuits used for many purposes, one function is to create multiple clock phases from a single phase, or differential pair of phases. FIG. 1 is a diagram of an example of a DLL 10. A voltage-controlled delay line 12 delays an input clock signal 14 in multiple steps. An output 16 of the delay line 12 is compared to a reference clock 18 using a phase detector 20, which is filtered (loop filter 22) and used to control 24 the voltage on the delay line 12. The phase detector 20 is an example of an alignment circuit; other embodiments are contemplated. For example, another implementation could include using higher-level system performance such as when the DLL outputs are provided to an IQ mixer, it could be possible to use the quality of the mixer performance to assess the delay mismatch for adjustment to provide the alignment circuit.

In a typical DLL configuration, such as the DLL 10, each delay cell 26 has a delay of 1 unit interval (UI) which is the delay between adjacent clock phases. All of the delays add up to 1 full period of the clock signal, so if there are N-phases at a clock frequency of F, a unit delay of $\Delta t=1/(F*N)$ is required. After N delays, the total delay accumulated on the delay line is $N*\Delta t=N/(F*N)=1/F$, and is a multiple of the input clock 14 period. Thus, the phase of the output 16 can be compared with the phase of the input, and the delay line 12 can be locked by aligning them.

As a conventional DLL requires that $\Delta t=1/(F*N)$, the delay scales inversely with the frequency and the number of phases. If the frequency increases, or if the number of phases required increases, the required delay decreases. For very high frequencies and high number of phases, this can become very difficult, as the minimum delay is dictated by the process technology (transistor speed and maximum supply voltage). As such, the process itself imposes a strict limit on the maximum frequency and number of clock phases generated, making it impossible to achieve a target frequency and number of phases if either/both are too high.

FIG. 2 is a graphical illustration of the delay associated with conventional operation of the DLL 10. Specifically, this graphical illustration is a circle with each of the N phases denoted by an arrow 30. Here, each of the N phases has a delay of $\Delta t=2\pi/N$ rad and the total delay is $N*2\pi/N=2\pi$ rad, i.e., one full rotation around the circle. In this example, N=8, so that $\Delta t=1/(8*F)$.

FIG. 3 is a graphical illustration of the delay associated with operation of the DLL 10 based on the present disclosure, namely modified operation to lock to different phases of the input clock period other than the one intended. Again, it is known that the DLL 10 can lock to different phases of the input clock 14 period other than the one intended. This is known as false locking. However, this is normally treated as a region that must be avoided, and is considered a design problem. Thus, conventional DLLs are designed so that the outputs of consecutive delay stages are consecutive clock phases.

The present disclosure takes advantage of this region of operation and uses it to implement a high frequency, high phase number DLL 10 that would otherwise be very difficult to achieve. By removing the restriction that the outputs of consecutive delay stages are consecutive clock phases, the DLL 10 circuit can be designed lock to a different phase of the input clock, including a multiple of the input clock 14. This modified operation can be referred to as phase skipping.

The approach described herein includes the DLL 10, where the delay of each delay cell 26 are k multiples of 1 UI, where k is co-prime with N (the number of delay cells and clock phases) [If k and N are not co-prime, but have a common factor of p, then the DLL will only be able to generate phases that are integer multiples of p]. The outputs of consecutive delay cells 14 are no longer adjacent clock phases, as the outputs of consecutive delays now skip clock phases. These missing clock phases can be generated by the delay line at subsequent points, by having the delay line accumulate a total delay greater than the input clock 14 period. This will only happen if k is co-prime with N. After N delays, the total delay will be $k*N*\Delta t=k*N/(F*N)=k/F$, which is still a multiple of the input clock period, thus, the locking condition and the general operation of the loop remain the same.

The proposed DLL 10 described herein includes each of the N phases having a delay of $\Delta t=2\pi k/N$ rad and the total delay is $N*2\pi k/N=2\pi k$ rad. Now, if k is an integer, the final phase will be congruent to the starting point and can be compared to the reference phase. If k and N are coprime, every phase at an integer multiple of $2\pi/N$ will be produced exactly once. Because the delay per stage has increased by a factor of k, the design constraint on the delay cell 26 has been relaxed by a factor of k, or the DLL 10 frequency can be increased by a factor of k.

In FIG. 3, this modified operation is graphically illustrated on a circle. Again, in this example, N=8, and k=3. Of note, 3 and 8 are coprime with one another. As shown in FIG. 3, each of the 8 phases are produced by relaxing the UI by a factor of 3.

Figure 4:
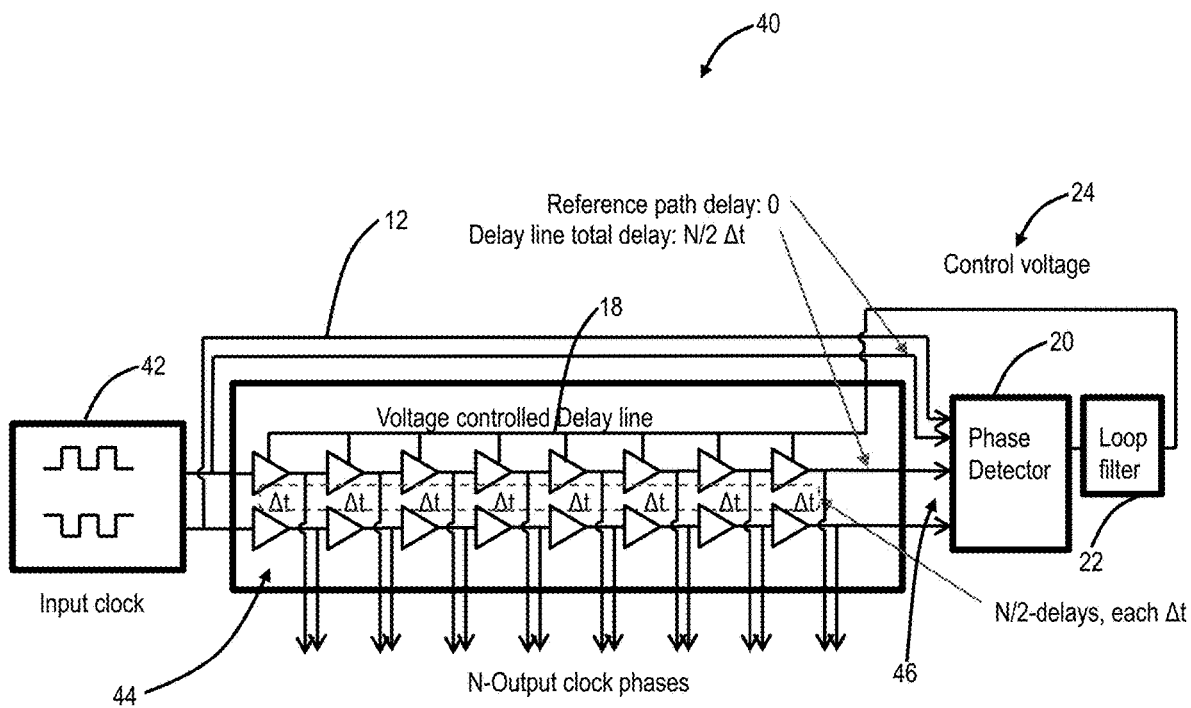
FIG. 4 is a diagram of a differential DLL.

FIG. 4 is a diagram of a differential DLL 40. The modified operation described above can also be expanded to include the differential DLL 40. In a differential DLL 40, there are 2 input clock 42 phases, each $\pi$ radians apart. To generate N clock phases, N total delay cells 44 are used in 2 separate delay lines, one for each clock path, each with a delay of $\Delta t=1/(F*N)$. Each delay path has N/2 delays (N must be even), so the delay accumulated on each path is $N/2*\Delta t=(N/2)/(F*N)=(\frac{1}{2})*(1/F)$, or half a clock period. To lock the loop, the two inputs from the input clock 42 are compared to two outputs 46. Since the delay adds $\pi$ radians, the output of each delay line is compared to the input of the opposite delay line.

As with the single ended case in the DLL 10, the modified operation can be extended to a differential DLL 40 by setting the delay of each delay element to k times the unit delay. In order for all of the phases to be generated, k must be coprime with N (and must be odd, since N must be even). This extends the delay of each path to $N/2*k*\Delta t=k*(N/2)/(F*N)=(k/2)*(1/F)$. As k must be odd, once the phase is unwrapped (by removing full periods) this results in an effective delay of $(\frac{1}{2})*(1/F)$, or half a clock period, keeping the locking condition and the general operation of the loop the same.

FIG. 5 is a graphical illustration of the delay associated with conventional operation of the differential DLL 40. Here, the input reference clock has two phases, each $\pi$ rad apart. Each phase passes through a delay line with N/2 delays, each with a delay of $\Delta t=2\pi/N$ rad. Total delay is $N/2*2\pi/N=\pi$ rad. Output phases are compared to the reference clock (the opposite phases are used to compare, so the $\pi$ rad reference phase is compared to the delay line fed by the 0 rad phase).

FIG. 6 is a graphical illustration of the delay associated with operation of the DLL 40 based on the present disclosure, namely modified operation to lock to different phases of the input clock period other than the one intended. Again, with the proposed operation, the input reference clock has two phases, each $\pi$ rad apart. Each phase passes through a delay line with N/2 delays, each with a delay of $\Delta t=2\pi k/N$ rad for some integer k. Total delay is $N/2*2\pi k/N=k\pi$ rad. If k is an integer and odd, the final phase will be congruent to the starting point of the opposite phase of the input phase and can be compared to that reference phase. If k and N are coprime, every phase at an integer multiple of $2\pi/N$ will be produced exactly once. Because the delay per stage has increased by a factor of k, the design constraint on the delay cell has been relaxed by a factor of k, or the DLL 40 frequency can be increased by a factor of k.

Figure 7:
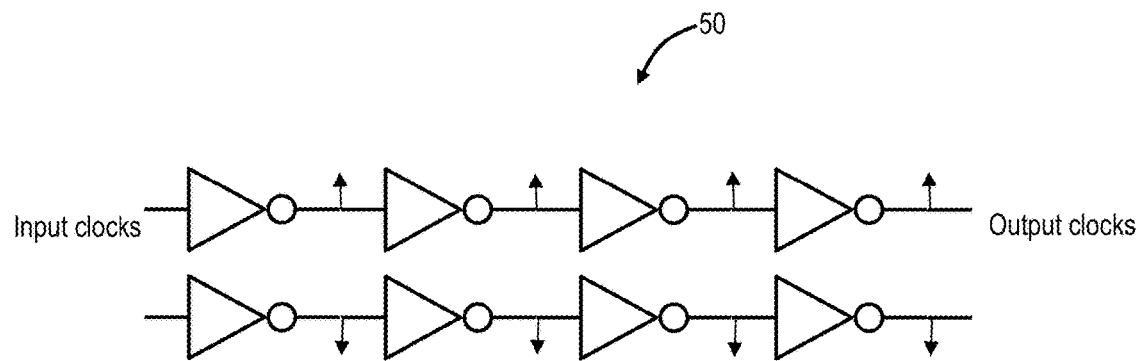
FIGS. 7 and 8 are diagrams of an inverter-based differential DLL.
Figure 8:
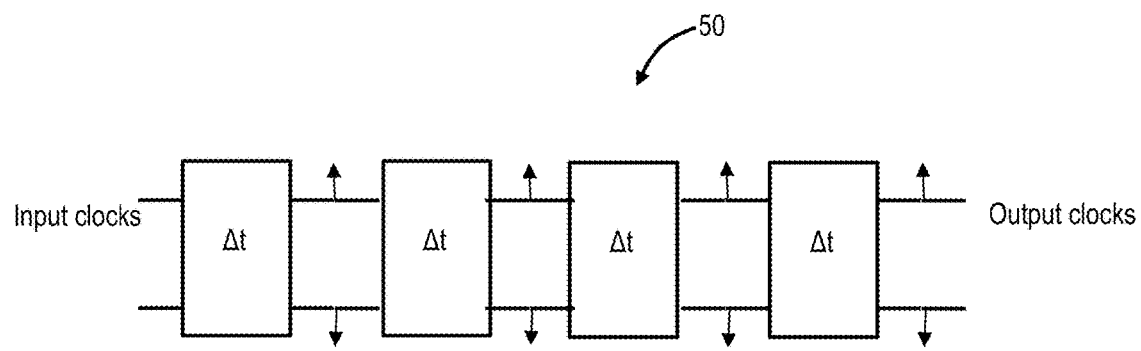

FIGS. 7 and 8 are diagrams of an inverter-based differential DLL 50. Of note, differential DLLs can be implemented with inverters, such as Complementary Metal-Oxide-Semiconductor (CMOS) inverters. Since an inverter has a natural $\pi$ radian phase shift (by inverting the signal), it can be seen as a special case of this where k=N/2+1. However, in conventional DLL design, differential inverter-based delay cells are treated as a pair of two separate non-inverting delays.

Figure 9:
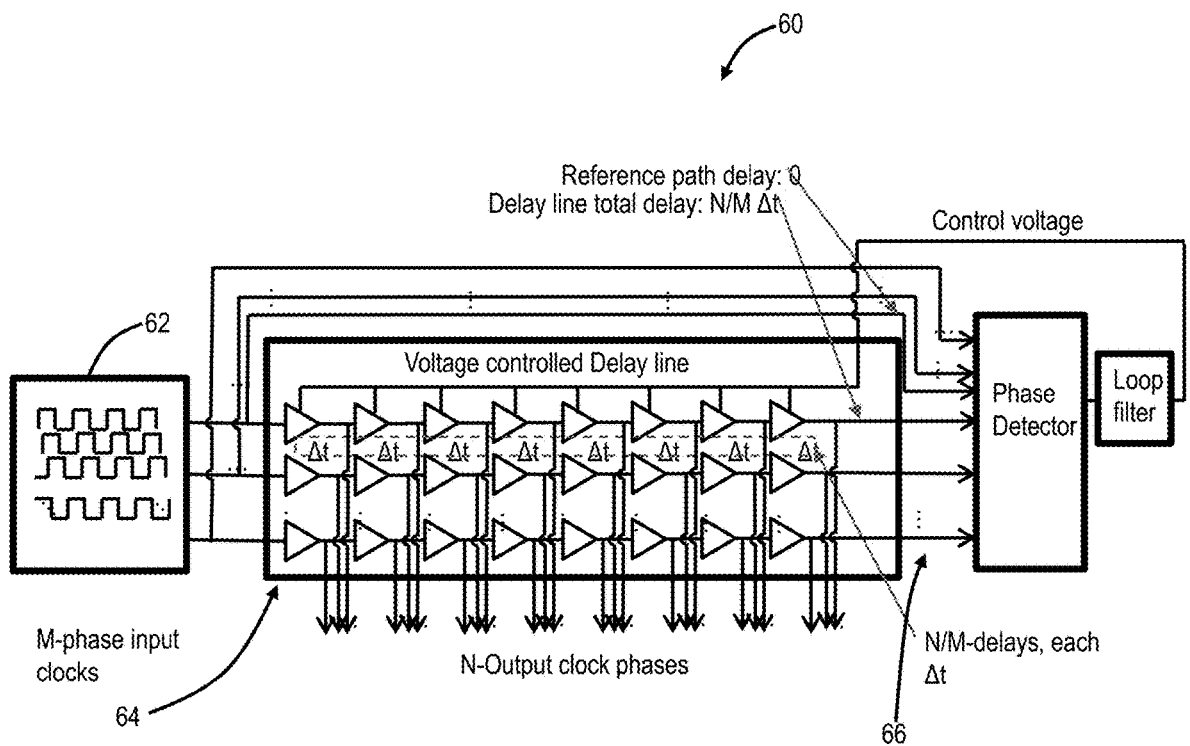
FIG. 9 is a diagram of an M-phase DLL.

FIG. 9 is a diagram of an M-phase DLL 60. Further, this modified operation can be extended to a M-phase DLL (e.g., a quadrature DLL that has four-phases). In an M-phase DLL 60, there are M input clock 62 phases, each $2*\pi/M$ radians apart. To generate N clock phases, N total delay cells 64 are used in M separate delay lines, one for each clock path, each with a delay of $\Delta t=1/(F*N)$. Each delay path has N/M delays (N must be an integer multiple of M), so the delay accumulated on each path is $N/M*\Delta t=(N/M)/(F*N)=(1/M)*(1/F)$, or 1/M of a clock period. To lock the loop, the M inputs are compared to the M outputs 66. Since the delay adds $2*\pi/M$ radians, the output of each delay line is compared to a different phase of one of the other delay line which is $2*\pi/M$ radians away. Of note, the differential DLL 50 is an example of M=2 for the M-phase DLL 60, and the M-phase DLL 60 contemplates implementation with inverters in an embodiment.

Generalizing the idea to a M-phase DLL requires setting the delay of each delay element (cell 64) to $k*\Delta t$, where k is an integer that is co-prime with N (and since N must be an integer multiple of M, k must also be coprime with M). This extends the delay of each path to $N/M*k*\Delta t=k*(N/M)/(F*N)=(k/M)*(1/F)$. As k must be co-prime with M, once the phase is unwrapped (by removing full periods) this results in an effective delay of $(k/M)*(1/F)$, or a multiple of 1/M of a clock period. The general operation of the loop remains the same, however the phase ordering of the phases going into the phase detector needs to be adjusted.

FIG. 10 is a graphical illustration of the delay associated with conventional operation of the M-phase DLL 60. Here, the input reference clock has M phases, each $2\pi/M$ rad apart. Each phase passes through a delay line with N/M delays, each with a delay of $\Delta t=2\pi/N$ rad. Total delay is $N/M*2\pi/N=2\pi/M$ rad. Output phases are compared to the reference clock (successive phases are used to compare, so the $2\pi/M$ rad reference phase is compared to the delay line fed by the 0 rad phase).

FIG. 11 is a graphical illustration of the delay associated with operation of the M-phase DLL 60 based on the present disclosure, namely modified operation to lock to different phases of the input clock period other than the one intended. Again, with the proposed operation, the input reference clock has M phases, each $2\pi/M$ rad apart. Each phase passes through a delay line with N/M delays, each with a delay of $\Delta t=2\pi k/N$ rad for some integer k. Total delay is $N/2*2\pi k/N=k\pi$ rad. If k is an integer and coprime with M, the final phase will be congruent to the starting point of a different branch and can be compared to that reference phase. If k and N are coprime, every phase at an integer multiple of $2\pi/N$ will be produced exactly once. Because the delay per stage has increased by a factor of k, the design constraint on the delay cell has been relaxed by a factor of k, or the DLL frequency can be increased by a factor of k.

In an embodiment, the M-phase DLL 60 includes identical N and k for each of the M paths. Different N and k are also possible: (call the N and k values in each of the paths N1, N2, N3, . . . and k1, k2, k3 . . . ), and consider the case of comparing N1 and N2 for the sake of illustration. The simplest case would be if N2 were an integer fraction of N1:N2=N1/p (making k2 the same integer multiple of k1:k2=p*k1). The function of the DLL would remain the same, but some of the outputs are omitted. This is functionally the same as just ignoring some of the outputs. It can be implemented as such as well-instead 1 delay element in path 2, you would use p delay elements, but of the same type as in path 1. Each delay element in path 1 and path 2 can be locked with the same control voltage.

A more complicated case is if N2 is NOT an integer fraction of N1. In this case for the DLL to lock, it would be constrained such that N1*k1=N2*k2. Because the delay in path 2 and path 1 are different, they would need different control voltages, and the locking circuit becomes slightly more difficult to design (you would need another phase detector output, and would need to devise a way to determine, given a phase offset, whether path 1 or path 2 should be corrected; failure to do so properly could cause the DLL to become unstable) The output of the DLL in such a case would be very irregular-instead of having N*M phases evenly distributed around the unit circle, it would have large gaps between some of the phase outputs and smaller gaps between others. This is NOT random-it is determined by the values of N1, N2, N3 . . . .

Figure 12:
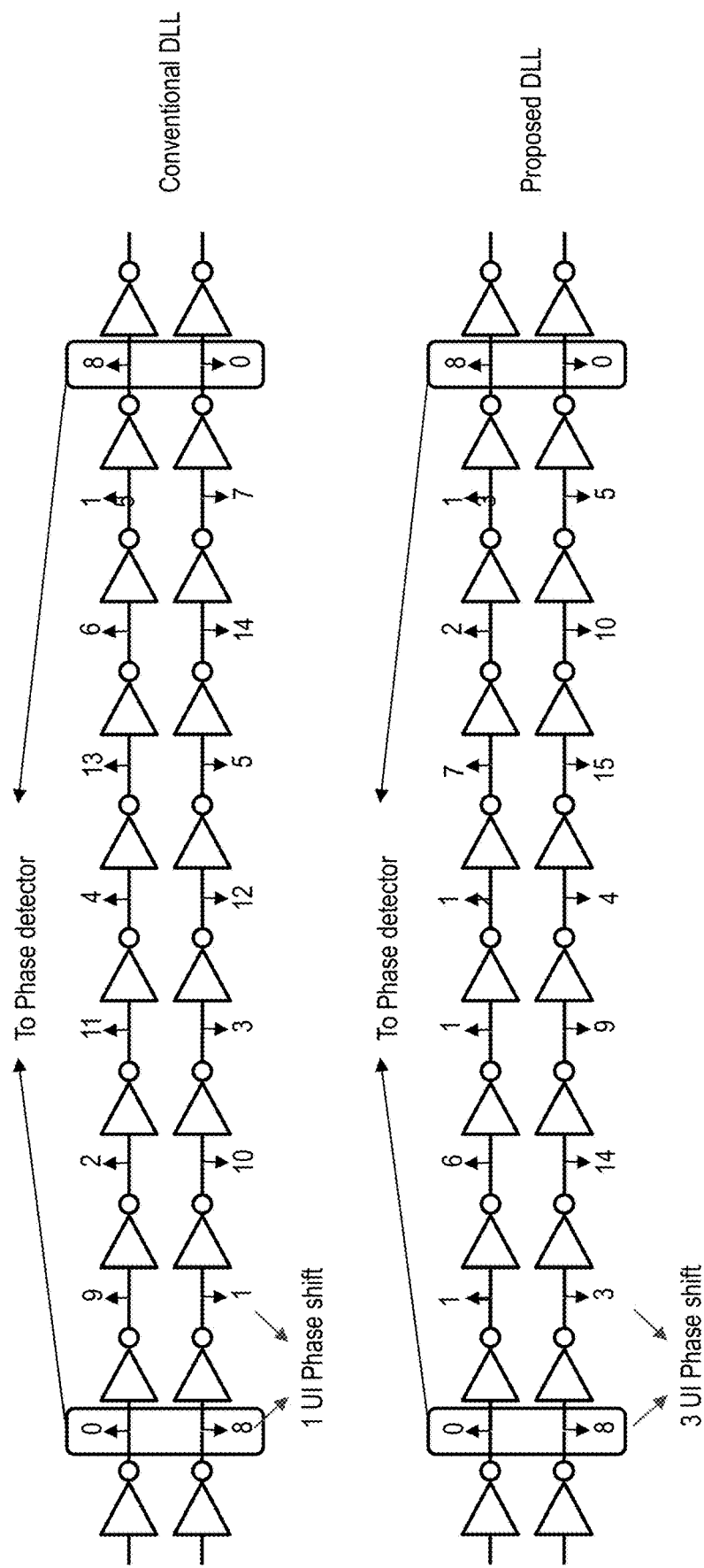
FIG. 12 is a diagram of an example of the phase reordering for a 16-phase DLL.

FIG. 12 is a diagram of an example of the phase reordering for a 16-phase DLL. The top figure shows a conventional DLL, and the bottom shows one with the phase skipping design. The required delay for a 11.25 GHz input clock has increased from 5.5 ps per stage to 16.5 ps per stage, while all of the 16 phases are still being generated, but in a different order. In an extracted simulation, this changed the design feasibility—the 5.5 ps target is difficult to achieve even with very high supply voltage and with minimal capacitive loading allowed, while the 16.5 ps target can easily be achieved with a low supply, even with a large capacitive load.

Figure 13:
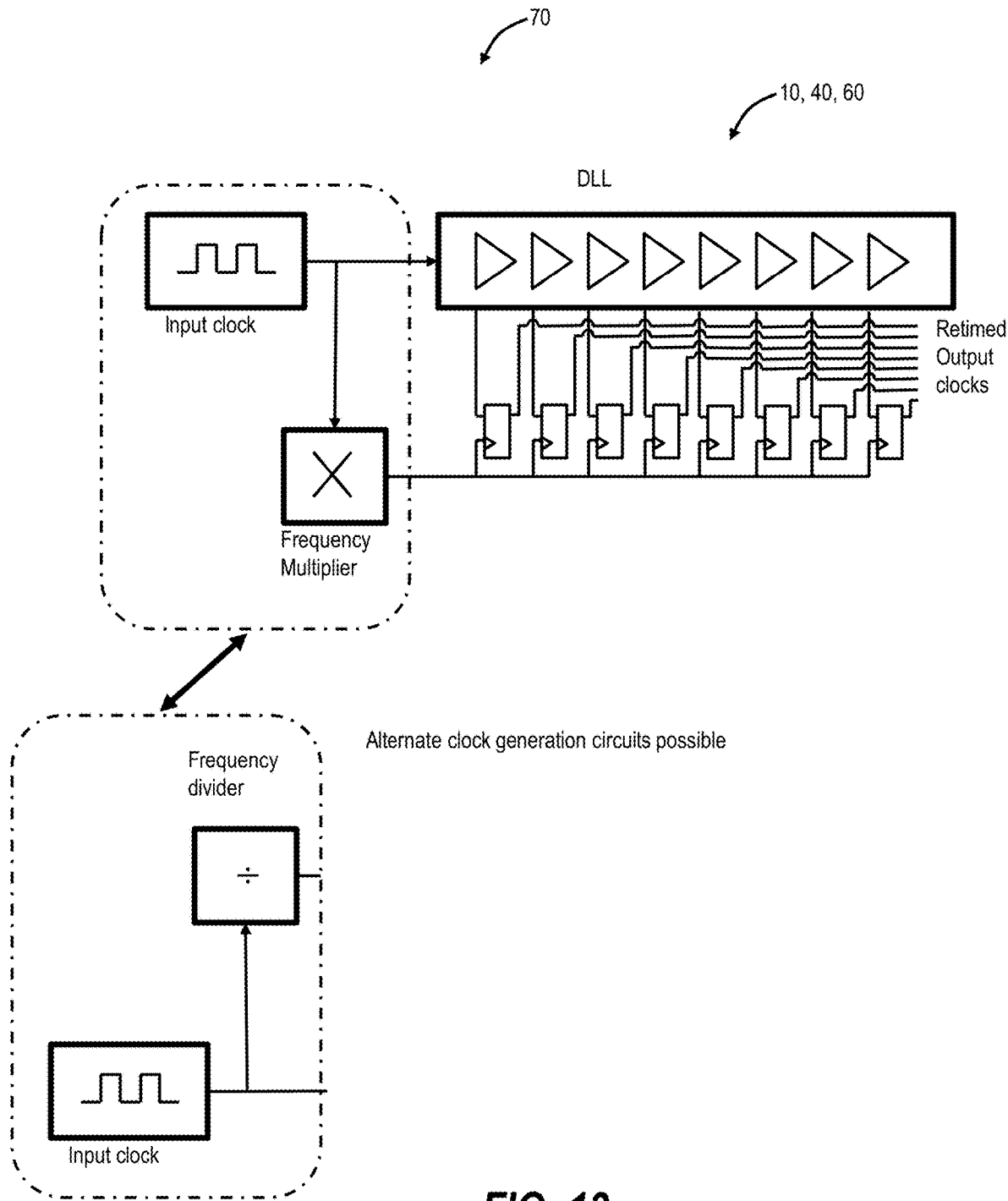
FIG. 13 is a diagram of a DLL retiming circuit utilizing one of the DLLs described herein.

FIG. 13 is a diagram of a DLL retiming circuit 70 utilizing one of the DLLs 10, 40, 60. Another function of this approach with the DLLs 10, 40, 60 is an ability to produce phase shifts that are smaller than a the fastest possible inverter delay to further increase the speed or time resolution of a circuit, as opposed to relaxing the delay constraint for an existing circuit. Here, a frequency multiplier, divider, etc. is connected to the N-output clock phases from the DLL 10, 40, 60 to produce retimed output clocks. This results in the generation of a set of lower frequency clocks offset by a short and very precise delay.

Figure 14:
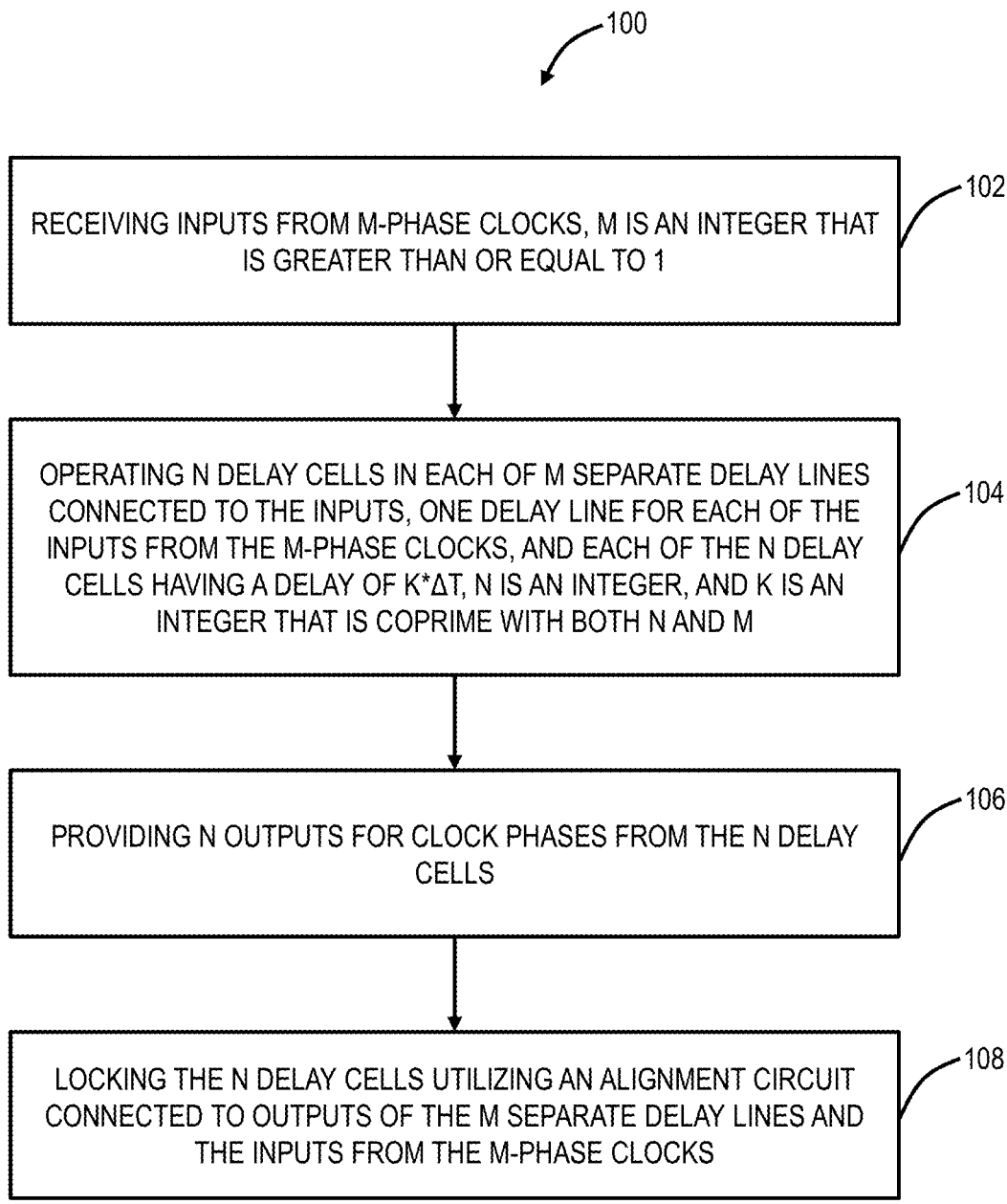
FIG. 14 is a flowchart of a process for operation of a DLL based on the modified approach described herein.

FIG. 14 is a flowchart of a process 100 for operation of a DLL 10, 40, 60 based on the modified approach described herein. The process 100 includes receiving inputs from M-phase clocks, M is an integer that is greater than or equal to 1 (step 102); operating N delay cells in each of M separate delay lines connected to the inputs, one delay line for each of the inputs from the M-phase clocks, and each of the N delay cells having a delay of k*Δt, N is an integer, and k is an integer that is coprime with both N and M (step 104); providing N outputs for clock phases from the N delay cells (step 106); and locking the N delay cells utilizing an alignment circuit connected to outputs of the M separate delay lines and the inputs from the M-phase clocks (step 108).

In an embodiment, M is greater than or equal to 2. Clock phases for the M-phase clocks are then each 2*pi/M radians apart.

Δt=1/(F*N) where F is a frequency of each of the M-phase clocks. A delay of each of the M separate delay lines is (k/M)*(1/F).

In an embodiment, N is even and k is odd.

In another embodiment, each of the N delay cells includes an inverter.

Outputs of consecutive delay cells are not adjacent clock phases. Missing clock phases between the consecutive delay cells are generated by the M separate delay lines at subsequent points from the consecutive delay cells.

The process 100 can further include utilizing a clock generation circuit connected to each of the N outputs for the inputs to provide retimed output clocks.

In conclusion, the proposed approach reuses the design for existing DLLs but relaxes the delay constraint on it (making it easier to design). Alternatively, this allows the DLL to be used for higher frequency applications than would otherwise be possible. Usage and testing is the same, as only a rerouting of the phase order is needed.

In another embodiment, a delay locked loop (DLL) circuit includes inputs from M-phase clocks, M is an integer that is greater than or equal to 1; N delay cells in each of M separate delay lines, one for each of the inputs from the M-phase clocks, and each of the N delay cells having a delay of k*Δt, N is an integer, and k is an integer that is coprime with both N and M; N outputs for clock phases from the N delay cells; and an alignment circuit connected to outputs of the M separate delay lines and the inputs from the M-phase clocks and configured to provide phase locking.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A delay locked loop (DLL) circuit comprising:
   inputs from M-phase clocks, M is an integer that is greater than or equal to 2, wherein clock phases for the M-phase clocks are each 2*pi/M radians apart;
   N delay cells in each of M separate delay lines, one delay line for each of the inputs from the M-phase clocks, and each of the N delay cells having a delay of k*Δt, N is an integer, and k is an integer that is coprime with both N and M;
   N outputs for clock phases from the N delay cells; and
   an alignment circuit connected to outputs of the M separate delay lines and the inputs from the M-phase clocks and configured to provide phase locking.

2. The DLL circuit of claim 1, wherein Δt=1/(F*N) where F is a frequency of the M-phase clocks.

3. The DLL circuit of claim 2, wherein a total delay of each of the M separate delay lines is (k/M)*(1/F).

4. The DLL circuit of claim 1, wherein N is even and k is odd.

5. The DLL circuit of claim 1, wherein each of the N delay cells includes an inverter.

6. The DLL circuit of claim 1, wherein outputs of consecutive delay cells in each of the M separate delay lines are not adjacent clock phases.

7. The DLL circuit of claim 6, wherein, for each of the M separate delay lines, missing clock phases between the consecutive delay cells are generated at subsequent points from the consecutive delay cells.

8. The DLL circuit of claim 1, further comprising
   a clock generation circuit connected to each of the N outputs to provide retimed output clocks for each of the M separate delay lines.

9. A method comprising:
   receiving inputs from M-phase clocks, M is an integer that is greater than or equal 2, wherein clock phases for the M-phase clocks are each 2*pi/M radians apart;
   operating N delay cells in each of M separate delay lines connected to the inputs, one delay line for each of the inputs from the M-phase clocks, and each of the N delay cells having a delay of k*Δt, N is an integer, and k is an integer that is coprime with both N and M;
   providing N outputs for clock phases from the N delay cells; and
   locking the N delay cells utilizing an alignment circuit connected to outputs of the M separate delay lines and the inputs from the M-phase clocks.

10. The method of claim 9, wherein Δt=1/(F*N) where F is a frequency of the M-phase clocks.

11. The method of claim 10, wherein a total delay of each of the M separate delay lines is (k/M)*(1/F).

12. The method of claim 9, wherein N is even and k is odd.

13. The method of claim 9, wherein each of the N delay cells includes an inverter.

14. The method of claim 9, wherein outputs of consecutive delay cells in each of the M separate delay lines are not adjacent clock phases.

15. The method of claim 14, wherein, for each of the M separate delay lines, missing clock phases between the consecutive delay cells are generated at subsequent points from the consecutive delay cells.

16. The method of claim 9, further comprising
   utilizing a clock generation circuit connected to each of the N outputs for the inputs to provide retimed output clocks for each of the M separate delay lines.

* * * * *